(12) United States Patent
Horesh et al.

(10) Patent No.: US 10,814,492 B2
(45) Date of Patent: Oct. 27, 2020

(54) APPARATUS AND METHOD FOR SURFACE TRAVERSING WITH CAPACITIVE SENSING OF SURFACE

(71) Applicants: Nizan Horesh, Caesarea (IL); Tal Levi, Tel-Aviv (IL)

(72) Inventors: Nizan Horesh, Caesarea (IL); Tal Levi, Tel-Aviv (IL)

(73) Assignee: R-GO ROBOTICS LTD, Caesarea (IL)

( * ) Notice: Subject to any disclaimer, the term of this patent is extended or adjusted under 35 U.S.C. 154(b) by 51 days.

(21) Appl. No.: 16/276,949

(22) Filed: Feb. 15, 2019

(65) Prior Publication Data
US 2020/0262086 A1 Aug. 20, 2020

(51) Int. Cl.
| | | |
|---|---|---|
| B25J 13/08 | (2006.01) | |
| G01B 7/02 | (2006.01) | |
| B25J 19/02 | (2006.01) | |
| H03K 17/955 | (2006.01) | |

(52) U.S. Cl.
CPC ............ *B25J 13/08* (2013.01); *B25J 19/02* (2013.01); *G01B 7/023* (2013.01); *H03K 17/955* (2013.01)

(58) Field of Classification Search
CPC .. G01N 27/82; G01N 27/902; G01N 27/9033; G01N 27/90; G01N 27/9013; G01Q 60/54; E21B 19/20
USPC .......................... 324/686, 235, 234, 228, 200
See application file for complete search history.

(56) References Cited

U.S. PATENT DOCUMENTS

| | | | | |
|---|---|---|---|---|
| 4,139,822 A | * | 2/1979 | Urich ................. | G01N 27/9033 324/219 |
| 5,388,447 A | * | 2/1995 | Fitch ................... | G01N 11/08 73/54.14 |
| 6,867,586 B2 | * | 3/2005 | Hatcher .............. | G01N 27/902 324/239 |
| 8,299,785 B2 | * | 10/2012 | Bousquet .......... | G01N 27/9033 324/220 |

(Continued)

FOREIGN PATENT DOCUMENTS

JP    2018150624 A    9/2018

OTHER PUBLICATIONS

International Search Report and Written Opinion dated May 14, 2020 for International Application No. PCT/IL2020/050156, 14 pages.

*Primary Examiner* — Giovanni Astacio-Oquendo
(74) *Attorney, Agent, or Firm* — Schwabe, Williamson & Wyatt, P.C.

(57) ABSTRACT

Apparatuses, methods and storage media associated with surface traversing by robotic apparatuses using capacitive sensing are described herein. In some instances, the apparatus comprises a body having at least one edge that faces a direction of traverse of a surface by the apparatus, and at least one capacitive probe disposed on or in proximity to the edge, to detect, during the traverse of the surface, a change in a dielectric property of a portion of the surface proximate to the edge. The dielectric property change indicates an obstacle associated with the surface portion. The apparatus further comprises circuitry configured to process the readings provided by the probe, such as to identify the obstacle, and generate instructions to adjust the traversing of the surface by the apparatus, based at least in part on a result of the probe readings processing. Other embodiments may be described and claimed.

20 Claims, 13 Drawing Sheets

(56) References Cited

U.S. PATENT DOCUMENTS

| | | | |
|---|---|---|---|
| 8,499,622 B2* | 8/2013 | Gaisnon | G01N 27/9033 73/112.01 |
| 2006/0097719 A1* | 5/2006 | Moore | G01N 27/82 324/237 |
| 2015/0121710 A1 | 5/2015 | McMurtry et al. | |
| 2015/0158182 A1 | 6/2015 | Farlow et al. | |

* cited by examiner

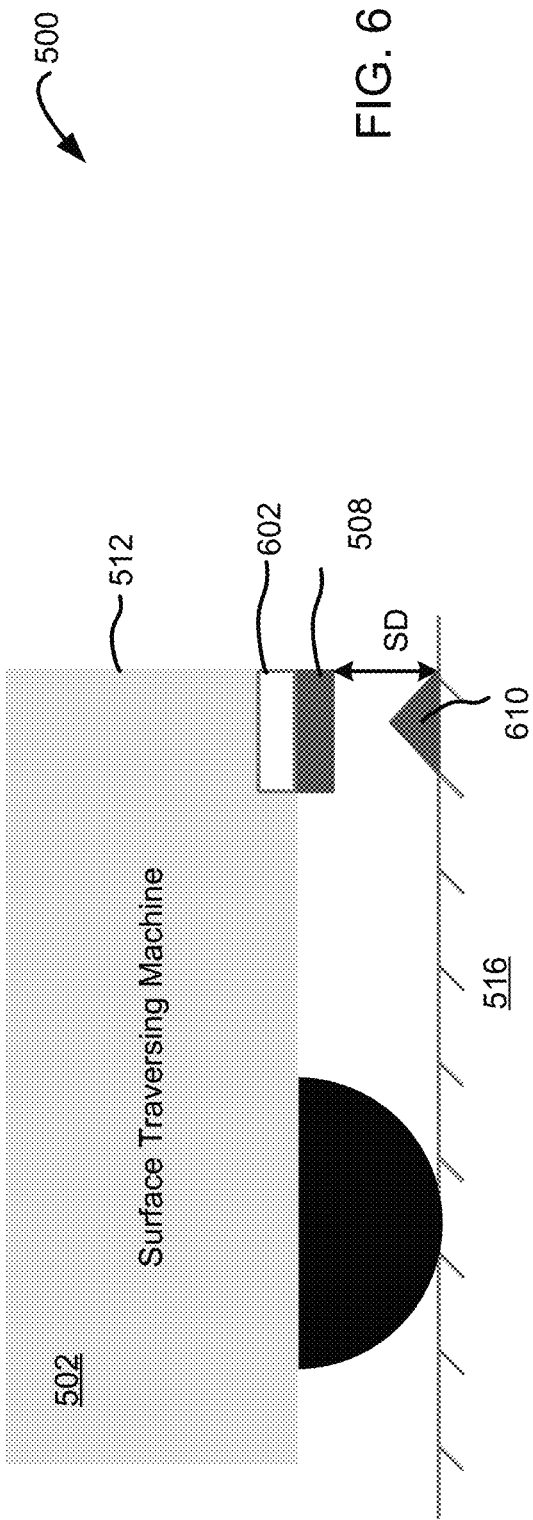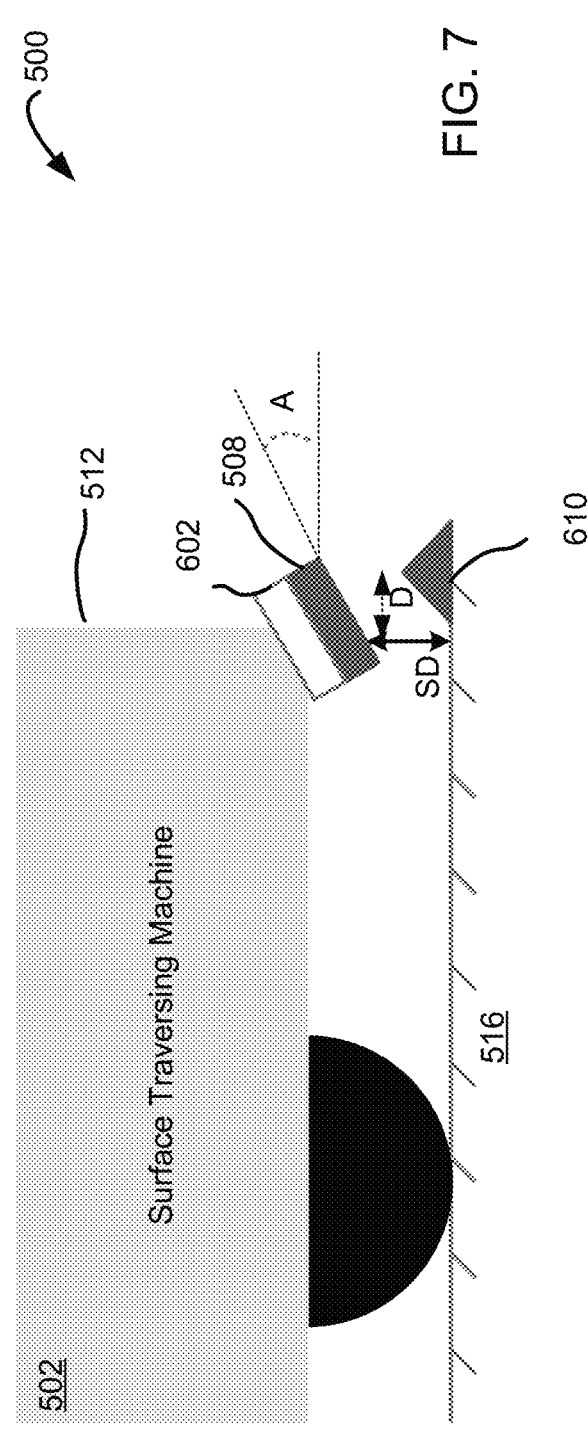

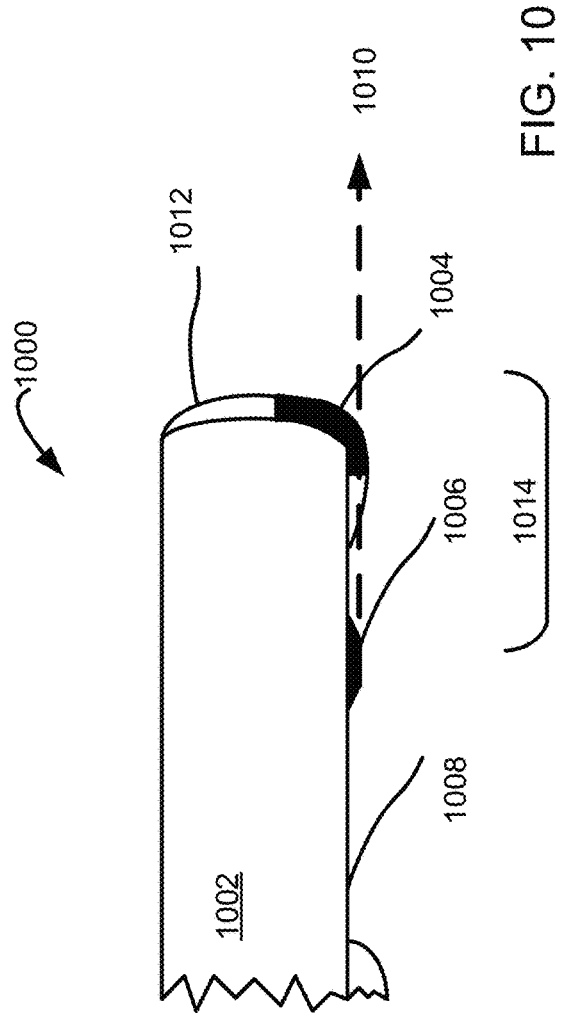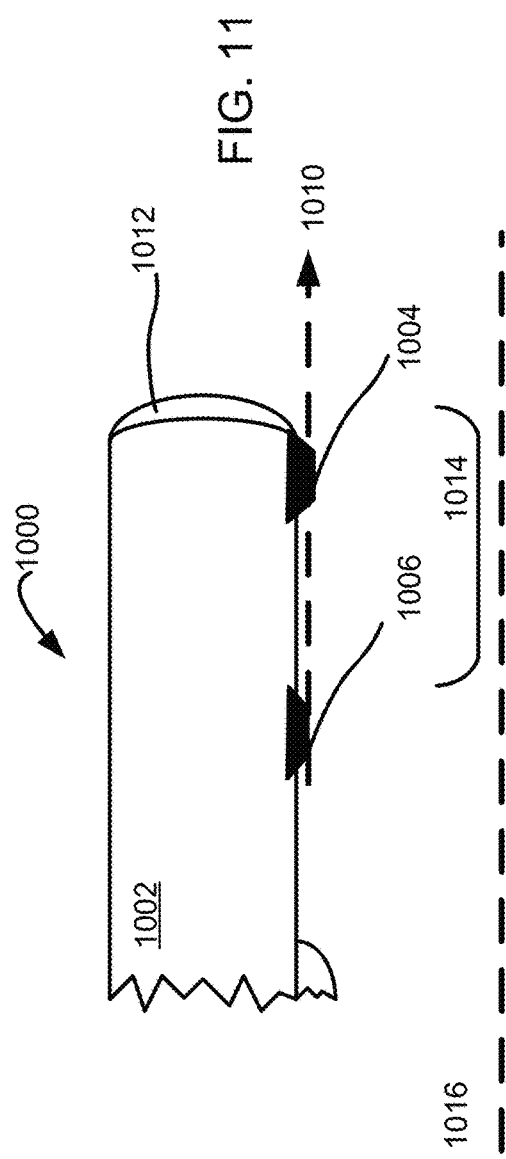

APPARATUS AND METHOD FOR SURFACE TRAVERSING WITH CAPACITIVE SENSING OF SURFACE

TECHNICAL FIELD

The present disclosure relates to the field of robotics, in particular, to apparatuses and methods associated with capacitive sensing for surface traversing machines.

BACKGROUND

The background description provided herein is for the purpose of generally presenting the context of the disclosure. Unless otherwise indicated herein, the materials described in this section are not prior art to the claims in this application and are not admitted to be prior art by inclusion in this section.

The dielectric coefficient is one of the characteristics of a substance. It describes the ratio between the permittivity of the substance to the permittivity of free space (vacuum). The measurements of the dielectric properties of different substances may distinguish these substances. The greater the difference between the dielectric coefficients of two substances, the greater the ability to distinguish the substances.

Typically, measurements of the dielectric properties of a substance may be provided with a capacitive probe. A capacitive probe is made from two plates that may be coplanar, parallel or at an angle relative to each other. The capacitance between two plates is dependent on the dielectric coefficient of the surrounding medium (substance) between the plates.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIGS. 5-8 illustrate example apparatuses for surface traversing with capacitive sensing of a surface, in accordance with some embodiments.

FIGS. 10-13 illustrate example dispositions of capacitive probes on a robotic apparatus for surface traversing, in accordance with some embodiments.

DETAILED DESCRIPTION

Figure 1:
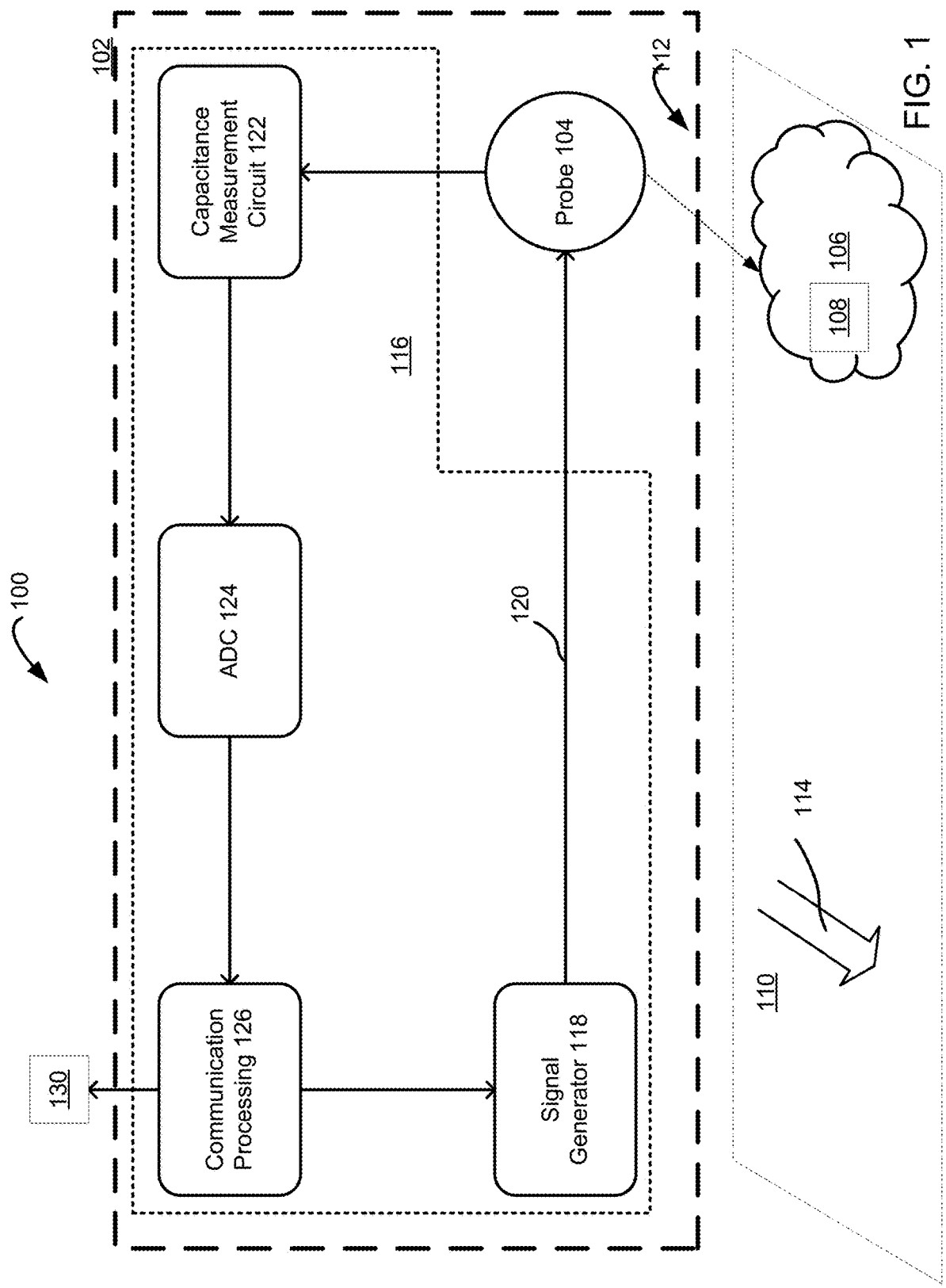
FIG. 1 is a block diagram illustrating an example system configured to detect obstacles during surface traversing by an apparatus, in accordance with some embodiments.

In the following detailed description, reference is made to the accompanying drawings which form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Apparatuses, methods and storage media associated with surface traversing by robotic apparatuses using capacitive sensing are described herein. In one instance, the apparatus for surface traversing comprises a body having at least one edge that faces a direction of traverse of a surface by the apparatus, and at least one capacitive probe disposed on or in proximity to the edge, to detect, during the traverse of the surface, a change in a dielectric property of a portion of the surface proximate to the edge. The dielectric property change (and corresponding change in surface capacitance) indicates an obstacle associated with the surface portion. The apparatus further comprises circuitry configured to process the readings provided by the probe, such as to identify the obstacle, and generate instructions to adjust the traversing of the surface by the apparatus, based at least in part on a result of the probe readings processing.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

A capacitive probe utilized in an apparatus for surface traversing described herein is made from two plates that may be disposed coplanar, parallel or at an angle relative to each other. The capacitance between two plates, either coplanar, parallel, or at an angle relative to each other, is dependent on the dielectric coefficient in the surrounding medium between the plates. As voltage is applied between the plates, an electric field develops in the medium between the plates, inducing an effective polarization in the medium. The effective electric displacement field in the medium is thus different from the applied electric field.

The capacitance between the probe plates depends on the electric displacement field, which in turn depends on the dielectric coefficient. As the dielectric coefficient increases the capacitance between the plates increases. Therefore, measuring the capacitance between the plates may provide a dielectric coefficient value and its change over the time and surface space covered (traversed) by the apparatus for surface traversing.

In conventional solutions, the probe should be calibrated in order to estimate the exact value of the dielectric coefficient, because the capacitance may have a complex dependency on the probe parameters. By measuring the capacitance change in the probe, the change in the surrounding medium's dielectric coefficient may be detected. Therefore, in order to distinguish between two substances that have a large difference in their dielectric coefficient the probe does not need to be calibrated. A change in the capacitance above a determined threshold may indicate an abrupt change in the probe's surrounding medium.

The electric displacement field passes through the different substances between the probe's plates. Measuring the capacitance gives an estimation of an "effective" dielectric coefficient, which depends on all the substances comprising the medium between the plates.

Typically (apart from the parallel plates probe), the electric field magnitude decreases with the distance from the probe plates (the parallel plates sense substance between the plates). Accordingly, the probe can sense changes in the substances that are in proximity to the probe's plates. The sensing distance depends on the probe characteristics, such as, for example, surface area of the plates, distance between plates, and the like.

The dielectric measurement may be conducted in several frequencies, taking advantage of the dependency of the dielectric coefficient on the measurement frequency. Since the dielectric coefficients of different substances present strong dependency on the frequency of the applied electric field, it is possible to find an optimal frequency for the identification of changes between certain substances in the probe's sensing area. In the embodiments described herein, the capacitive sensing using a capacitive probe is utilized to measure the change in the dielectric medium (e.g., surface substance) over space, in order to detect a change in the medium. The detected change in the medium can indicate a substance change or obstacles associated with the surface, such as a presence of liquid on a solid state surface; a surface anomaly, such as unevenness or obstructions on the surface; or an edge of the surface, such as a cliff, a bluff, a precipice, or an escarpment.

FIG. 1 is a block diagram illustrating an example system configured to detect obstacles during surface traversing by an apparatus, in accordance with some embodiments. In embodiments, the system 100 may include one or more probes 104 (hereinafter "a probe" for purposes of understanding), to be disposed on a surface traversable apparatus 102 (indicated by a dashed line). The probe 104 may be configured to detect, during a traverse of a surface 110 by the apparatus 102, a change of a dielectric property of a portion 106 of the surface 110 proximate to the apparatus 102.

In embodiments, the probe 104 comprises a capacitive probe, and is configured to sense a change in capacitance of the surface portion 106. The capacitance change sensed by the probe 104 indicates a change of the dielectric property of the surface portion 106. Correspondingly, the surface portion 106 dielectric property change indicates a change in the surface portion 106, such as an obstacle 108 associated with the surface portion 106. As will be described below in greater detail, the capacitive probe 104 may be disposed on or in proximity to an edge 112 of the apparatus 102, e.g., facing a direction of traverse 114 of the surface 110 by the apparatus 102. In embodiments, the probe 104 may comprise different shapes, some of which are described in reference to FIGS. 2-4.

In embodiments, the system 100 further includes circuitry 116 (indicated in FIG. 1 by the dotted line), coupled to the capacitive probe 104. The circuitry 116 may be configured to process capacitance readings provided by the capacitive probe 104, or cause an external device 130 to process the capacitance readings. In embodiments, the circuitry 116 includes a signal generator 118, configured to induce an alternate voltage signal 120 to the probe 106 coupled with the signal generator 118.

The circuitry 116 includes a capacitance measurement circuit 122, configured to measure capacitance readings sensed by the probe 104 (in embodiments, the probe's impedance), and an analog-to-digital converter (ADC) 124, to convert the measured readings into a digital format. The circuitry 116 further includes a communication and/or processing unit 126 coupled with the ADC 124, configured to receive the digital readings of capacitance from ADC 124. In embodiments, the communication and/or processing unit 126 may communicate the received readings to the external device 130 for processing.

In some embodiments, the communication and/or processing unit 126 may be configured to process the readings. For example, the unit 126 can be configured to identify or cause to be identified the obstacle 108 on the surface portion 106, based at least in part on the processed readings, and adjust or cause to be adjusted a trajectory (e.g., direction 114, speed, and/or the like) of the surface traversing by the apparatus 102, based at least in part on the detected obstacle 108. In embodiments, the communication and/or processing unit 126 may comprise some or all of the components of a computing device, described below in reference to FIG. 15.

In embodiments, the communication and/or processing unit 126 may be configured to provide control over the measurement process (indicated by arrow 132 to signal generator 118), for example, by starting and stopping the measurement process by probe 104. In case of multiple probes, this control may allow probe selection and control over measurement sequence or pattern. In some embodiments, unit 126 can control modulation to the signal provided by the signal generator 118 to the probe 104, for example, including increased gain or frequency shift.

The sensed capacitance depends on the capacitive probe configuration. Different probe shapes may increase the sensitivity of the measurement. A capacitive probe does not need an ohmic contact with a substance to measure its dielectric properties. Therefore, a capacitive probe can be isolated from the external environment and can measure changes of the medium in the probe sensing area without direct contact with the medium.

Figure 2:
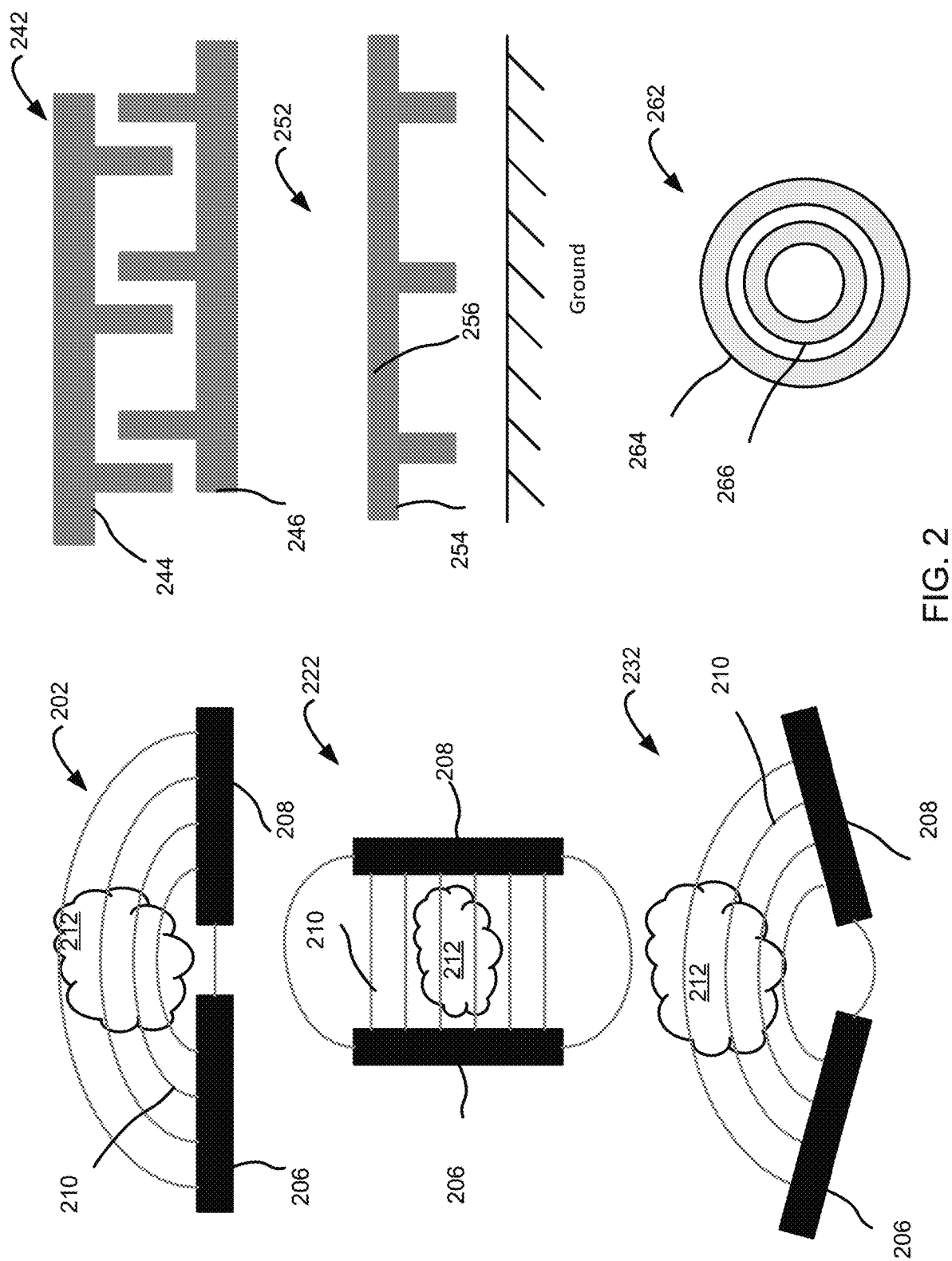
FIGS. 2-4 illustrate example configurations of a capacitive probe that may be utilized by the system of FIG. 1, in accordance in some embodiments.
Figure 3:
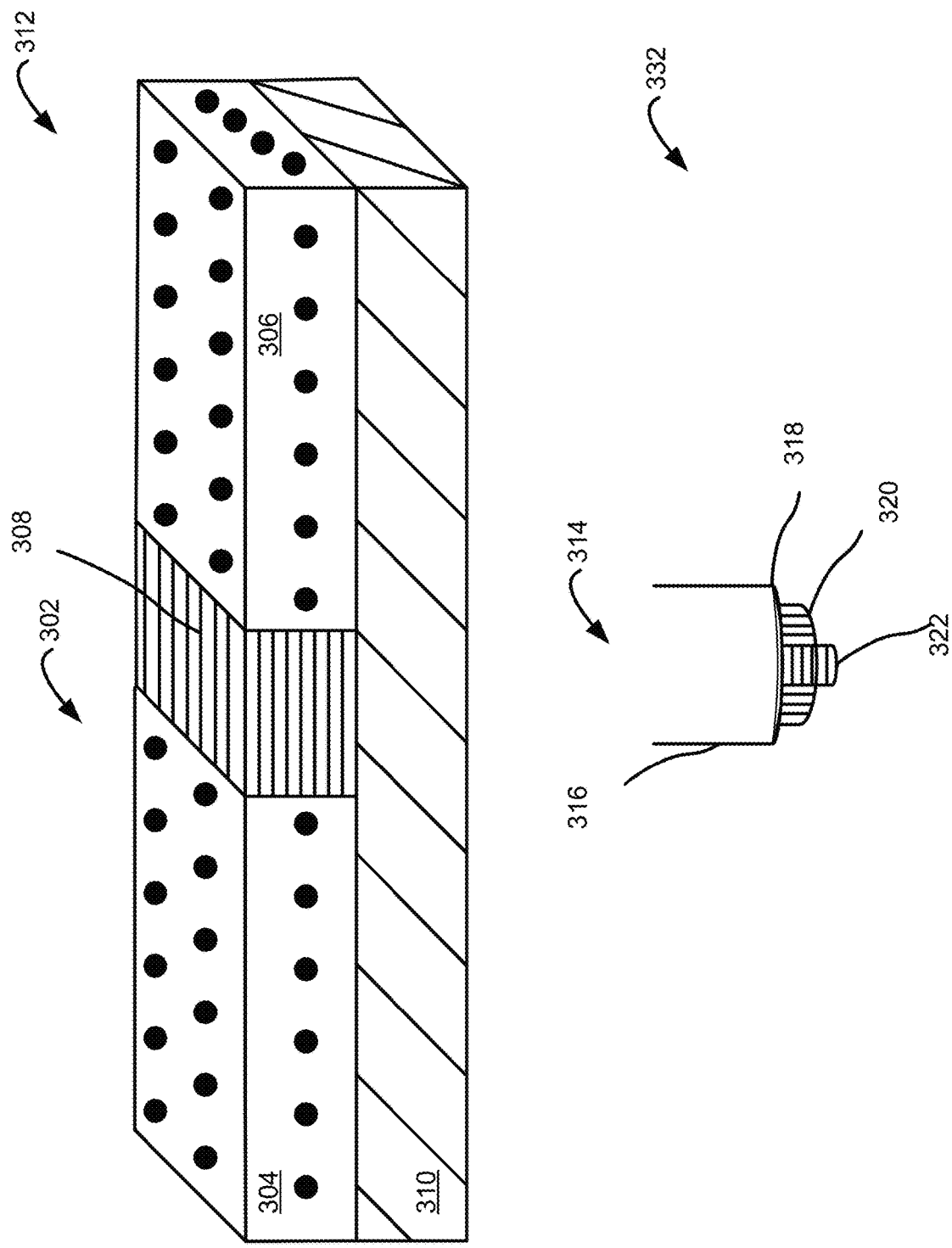
Figure 4:
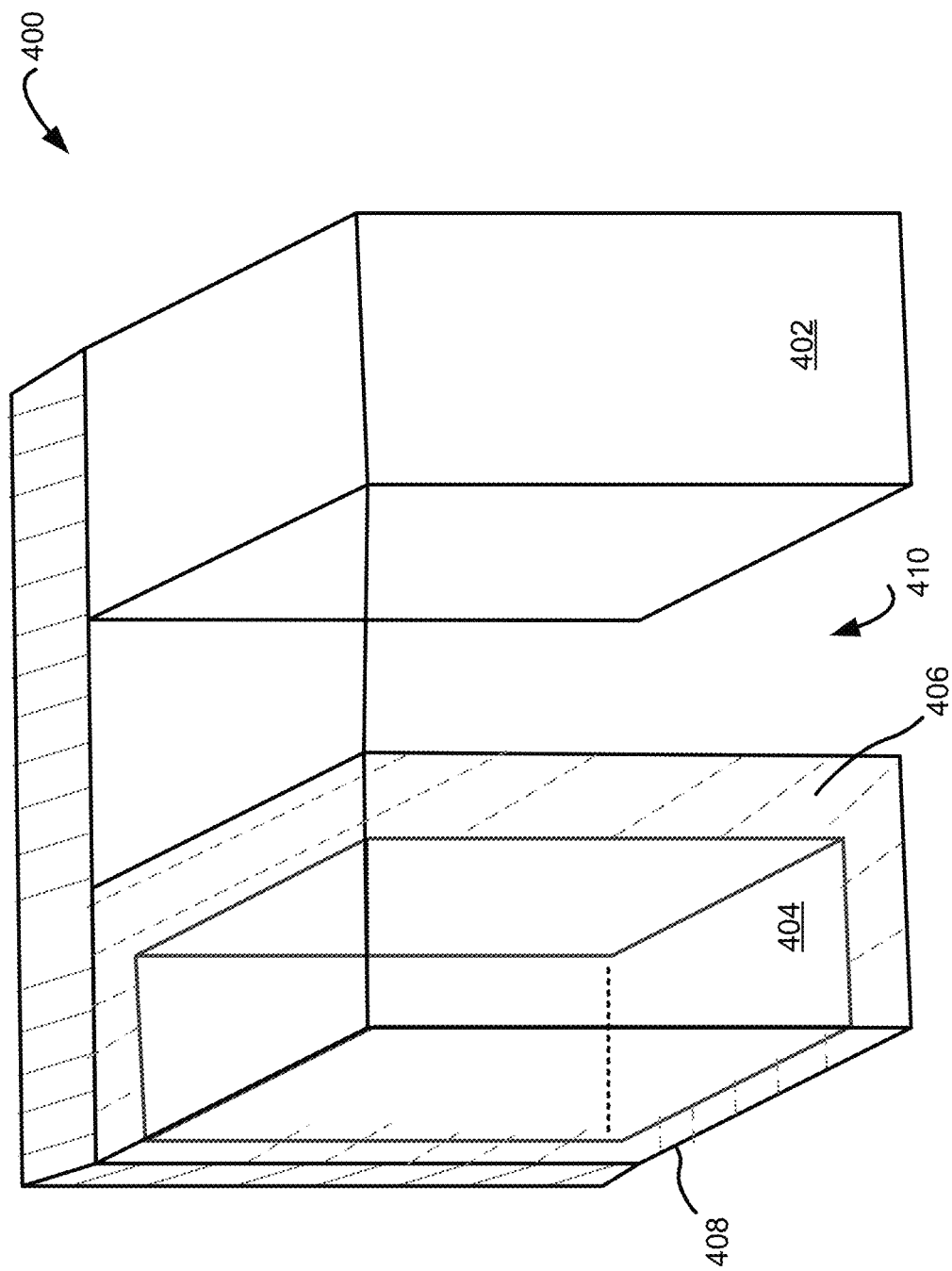

FIGS. 2-4 illustrate example configurations of a capacitive probe that may be utilized by the system of FIG. 1, in accordance in some embodiments.

Views 202, 222, and 232 of FIG. 2 illustrate a capacitive probe with metal plates 206 and 208. The spatial configuration of the plates 206 and 208 may vary. As shown, the metal plates 206 and 208 may be coplanar (view 202), parallel (out of plane, view 222), or disposed at an angle to each other (view 232). The electric field 210 generated in response to a provision of voltage to the plates 206 and 208 (e.g., by the signal generator 118 of FIG. 1) passes through a substance under examination 212 (e.g., surface portion 106 of FIG. 1).

The probe plates can take different shapes apart from the two plate configuration shown in views 202, 222, and 232, depending in the application. For example, the probe plates can be coplanar comb plates 244 and 246 (view 242 of FIG. 2), parallel comb plates 254 and 256 (out of plane, view 252), or coplanar ring plates 264 and 266 (view 262). In embodiments, probe shown in view 242 has increased surface area compared to conventional solutions, so it can detect smaller changes of capacitance (compared to conventional solutions). The probe shown in view 252 goes out of the apparatus surface, and accordingly has greater sensitivity than a conventional probe.

In embodiments, the capacitive probe can be a planar probe 302, shown in view 312 in FIG. 3. As shown, the probe 302 may include contacts 304 and 306 separated by a dielectric material layer 308 disposed in plane with the contacts 304 and 306. The contacts 304 and 306, and the layer 308 are disposed on a dielectric substrate layer 310. The layers 306 and 310 may have different dielectric coefficients E1 and E2 respectively.

In embodiments, the capacitive probe can be a coaxial probe 314, shown in view 332 of FIG. 3. As shown, the probe 314 may include an isolator 316 surrounding a metal layer 318 and a dielectric layer 320, inside which a center pin 322 (e.g., metal pin) is disposed in coaxial manner.

FIG. 4 illustrates another example capacitive probe that can be used in the system of FIG. 1, in accordance with some embodiments. As shown in FIG. 4, the probe 400 is an insulated probe comprising of two metal plates 402 and 404, immersed in dielectric material 406, and coated with hydrophobic coating (e.g., hydrophobic shield) 408. (For purposes of explanation, just one of two metal plates 404 is shown as immersed in insulator and coated with hydrophobic shield.)

The probe 400 is configured to sense fluids via a non ohmic contact when the fluid goes through the gap 410 between the plates. The probe 400 can sense fluid (even inside a thick rug) without smearing it due to the non-galvanic nature of the probe. Specifically, hydrophobic shielding allows for sensing of the fluid without smearing fluid on the surface, such as smearing the water stain on the floor, as the probe 400 passes on the surface. Accordingly, the probe 400 is configured for the specific use of fluid sensing by a robot, such as apparatus 102 of FIG. 1.

FIGS. 5-8 illustrate example apparatuses for surface traversing with capacitive sensing of a surface, in accordance with some embodiments. Some of the components of the surface traverse apparatus were described in reference to FIG. 1. In embodiments, the apparatuses of FIGS. 5-8 comprise robotic devices.

Figure 5:
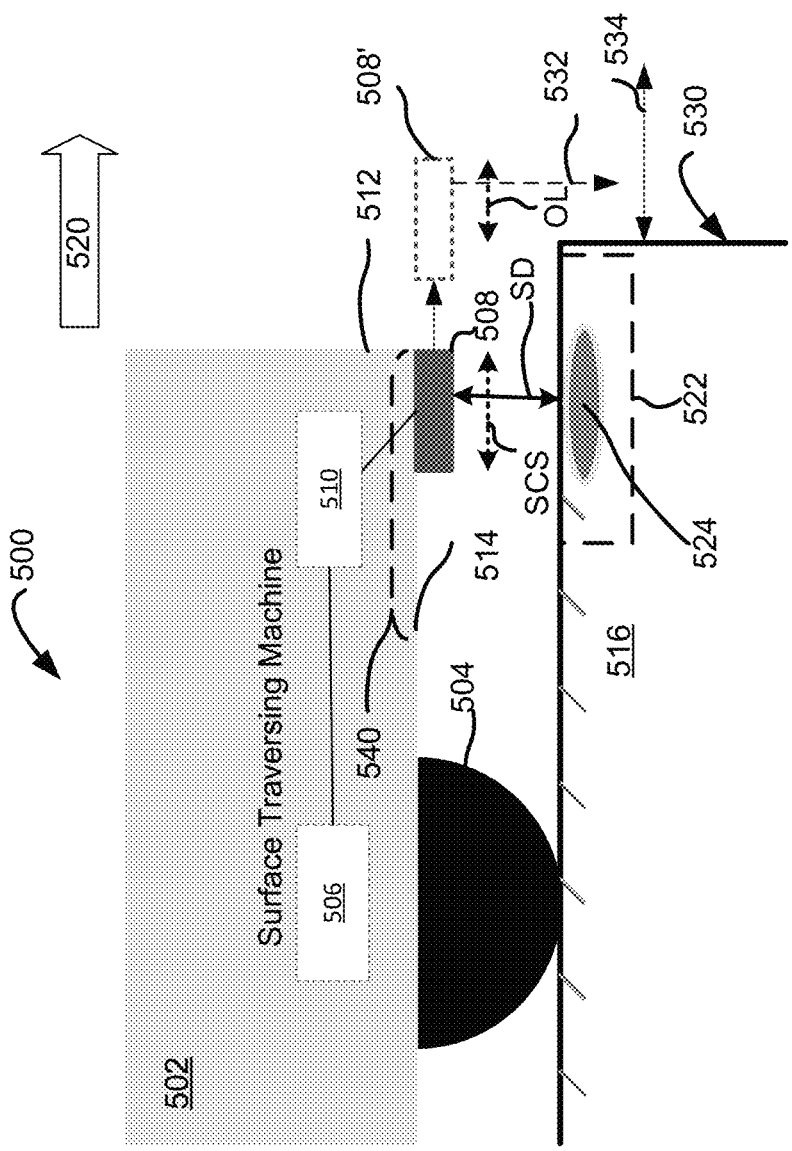

As shown, e.g., in FIG. 5, a surface traversing machine (apparatus) 500 includes an apparatus body 502, a surface traversing means (e.g., wheels) 504, and a motor 506 to operate the surface traversing means 504. The motor 506 may be disposed inside the body 502. The apparatus 500 further includes one or more capacitive probes 508 (e.g., similar to ones described in reference to FIGS. 2-4) disposed on the apparatus body 502, and circuitry 510 (e.g., disposed inside the body 502) coupled with the probe 508 and motor 506, to process the readings of the probe 508 and operate the apparatus 500 in response to the results of the processing.

In embodiments, the capacitive probe 508 may be disposed in an area 540 of the body 502. Specifically, the probe 508 may be disposed on or in proximity to an edge 512 of the body 502. For example, the edge 512 may be a front end of the apparatus 500, facing the direction 520 of the traverse. In the example of FIG. 5, the probe 508 is disposed on the bottom area 514 of the body 502, proximate to the edge 512, substantially parallel to and facing a traversable surface 516. As shown, the probe 508 is disposed at a sensing distance SD from the surface 516.

As shown in FIG. 5, SD refer to the distance to the idealized traversed plane, e.g., the plane that is free of bumps and other surface anomalies. The probe is sensitive in a small SD values (e.g., about 5 cm). In addition, the probe measurement is dependent on the distance from the dielectric medium, for example, if SD is small enough the probe can measure the dielectric of the floor surface on which the apparatus 500 is moving. Therefore, it is desirable to keep SD constant, so the measurements change over time will be due to the change in the dielectric medium and not to changes in SD. This would allow for detection of bumps and other small surface anomalies. For the purpose of measuring pure dielectric change (rather than geometric one, e.g. wet spot on a carpet), the described embodiments, provide for detection of a change in the dielectric constant (such as water) without the need for the material being detected due to change the geometry.

As discussed in reference to FIG. 1, the capacitive probe 508 may be configured to detect, during the traverse of the surface, a change in a dielectric property of a portion 522 of the surface 516 proximate to the edge 512. The dielectric property change indicates an obstacle 524 associated with the surface portion 522.

In embodiments, the apparatus 500 with the capacitive probe sensing is configured to detect a presence of the fluid on the surface 516. In other words, the detected obstacle 524 may comprise a fluid (e.g., a spill, a puddle, or the like) disposed on the surface portion 522. The techniques for fluid and spill detection described herein have several advantages compared to existing solutions. For example, the fluid detection with a capacitive probe does not require direct contact with the fluid being detected. Furthermore, the described techniques provide for detection of fluids absorbed in an absorbent, for example, spills on a carpet.

The described techniques do not expose any electric circuit to the external environment of the apparatus 500 as no ohmic contact is required for detection with a capacitive probe. Further, the apparatus 500 needs to traverse a small area (e.g., around four squared centimeters) of the fluid to detect a spill. The apparatus 500 can detect the abrupt change of the dielectric properties of the surface due to the presence of the fluid very quickly, e.g., in a range of 1-10 milliseconds. Accordingly, the apparatus 500 may react (e.g., stop) before making actual contact with the fluid 524.

In embodiments, the apparatus 500 with the capacitive probe sensing is configured to detect a presence of an edge 530 of the surface 516. The edge 530 may include, for example, a cliff, a bluff, a precipice, or an escarpment. In common robotic devices, cliff detection is performed by an active optical sensor, comprised from an illumination ((e.g., infrared (IR)) and a receiver diode. Such cliff detection is typically localized, e.g., only a small part of the surface (typically about one square centimeter) can be measured. Therefore, the robot needs multitude of detectors to ensure the surface edge or cliff detection. The optical sensors are sensitive to obstruction (e.g., by dirt) and may fail when the apparatus is traversing a dark surface, causing a false detection.

The described embodiments of using a capacitive probe on a surface traversing apparatus to sense a surface can measure a wide area using a single probe and are less sensitive to obstructions, such as accumulated dirt or the like. The described herein capacitive probe measurements provide for surface edge (cliff) detection in response to sensing an absence of the dielectric substance (ground) below the probe. For example, with reference to FIG. 5, if the apparatus 500 with the probe 508 moves forward, so that the probe 508 moves to a position 508', the probe 508 can detect 532 the absence of the surface in the area 534 (to the right of the edge 530 in FIG. 5). In the described example, the edge 530 can be identified with a small overlap OL of the probe 508 over the area 534, due to the probe's small sensing cross section SCS (e.g., about four squared centimeters) allowing the apparatus 500 to stop before falling into the area 534.

If the capacitive probe is kept at a constant height above the surface, changes in the surface shape (e.g., obstacles such as bulges, unevenness or the like) may cause a change in the capacitance probe's measurement. Accordingly, the probe can detect the surface anomalies. As shown in FIG. 6, surface anomalies 610, such as bulges or different substances on the surface plane may be detected providing a stabilization mechanism (stabilizer) 602 coupled with the probe 508 and disposed around the edge 512 similar to the example of FIG. 5, e.g., substantially parallel to and facing the surface 516 plane. The stabilizer 602 may be configured to keep the probe 508 at a constant distance SD above the surface 516.

In embodiments, the stabilizer 602 is meant to compensate for small tilts of the apparatus 500 (e.g., tilts at an angle about 5 degrees or less relative to the surface). For example, if the apparatus is tilted, the probe may not remain at a constant distance to the surface, a gimbal may be sufficient to reduce the noise from the apparatus 500 tilt. Due to shakes of the body 502 of the apparatus 500, the obstacle may not remain at a constant distance and this is what the probe 508 detects as a surface anomaly. The effect of the robot tilt on the measurements by the probe 508 should be canceled (e.g., using stabilizer 602). The addition of a sensor to include the distance of the robot's surface to the floor in order to compensate in computation is discussed below in reference to FIG. 8

As shown in FIG. 7, the probe 508 (and stabilizer 602) can be mounted on the edge of the apparatus 500 in a "forward looking" manner in order to detect anomalies at a distance D from the apparatus edge 512 (e.g., 4-5 centimeters), keeping constant distance SD from the surface 516. For example, the probe 508 and stabilizer 602 may be tilted at an angle A relative to the surface 516 plane, in order to provide a forward sensing.

Figure 8:
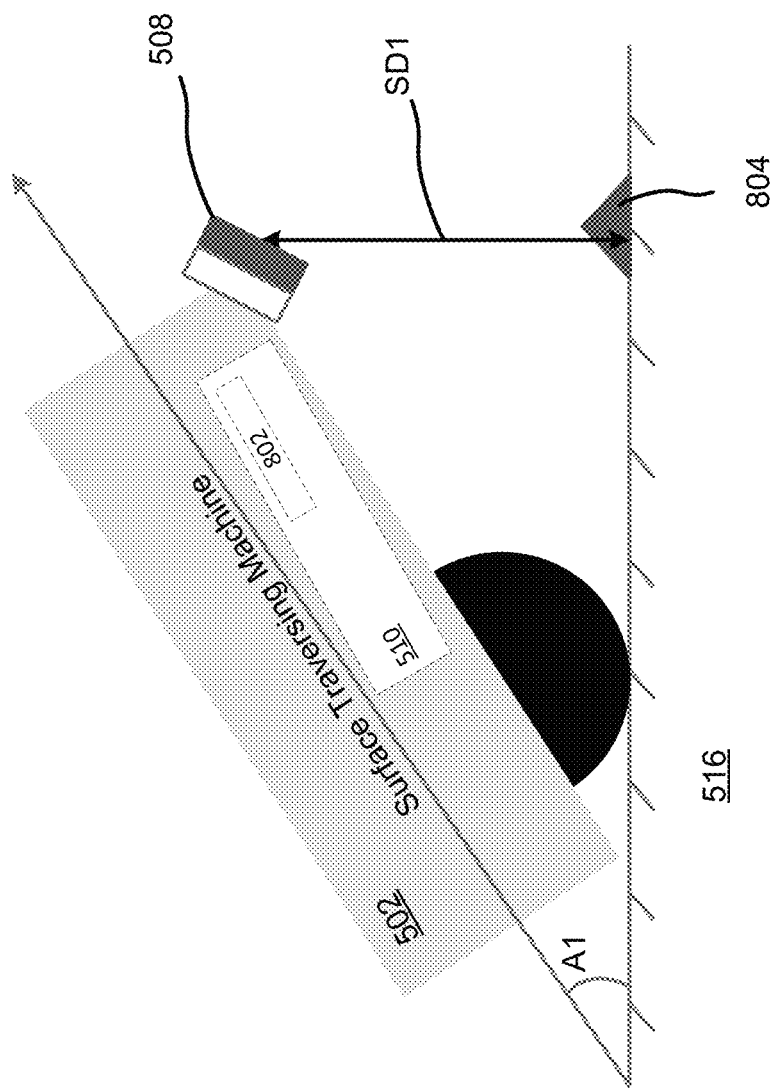

In some embodiments, information about the distance between the capacitive probe and the surface may be utilized to compensate for the capacitive probe sensitivity to the distance of the dielectric medium. As shown in FIG. 8, the distance from the probe 508 to the surface 516 may be affected by the apparatus 500 tilt (e.g., at an angle A1 relative to the surface 516). This bias may affect (e.g., cancel) the signal from the surface anomaly 804. In order to minimize or cancel this bias, a measurement of a distance SD1 between the probe 508 and the surface 516 caused by the tilt may be performed.

The information about the distance SD1 between the capacitive probe 508 and the surface 516 can be obtained by one or more of the following techniques. As shown in FIG. 8, the circuitry 510 may include a sensor arrangement 802 (e.g., a camera) that computes the planar homography transformation of the flat surface between image frames and use the planar homography to estimate the distance SD1 from the probe 508 to the surface 516. In another example, the circuitry 510 may include an inertial measurement unit (IMU) that measures the apparatus 500 platform tilt (angle A1) and thus can estimate the distance SD1. Other techniques known in the art can be used to estimate the distance SD1 between the probe 508 and the surface 516.

Figure 9:
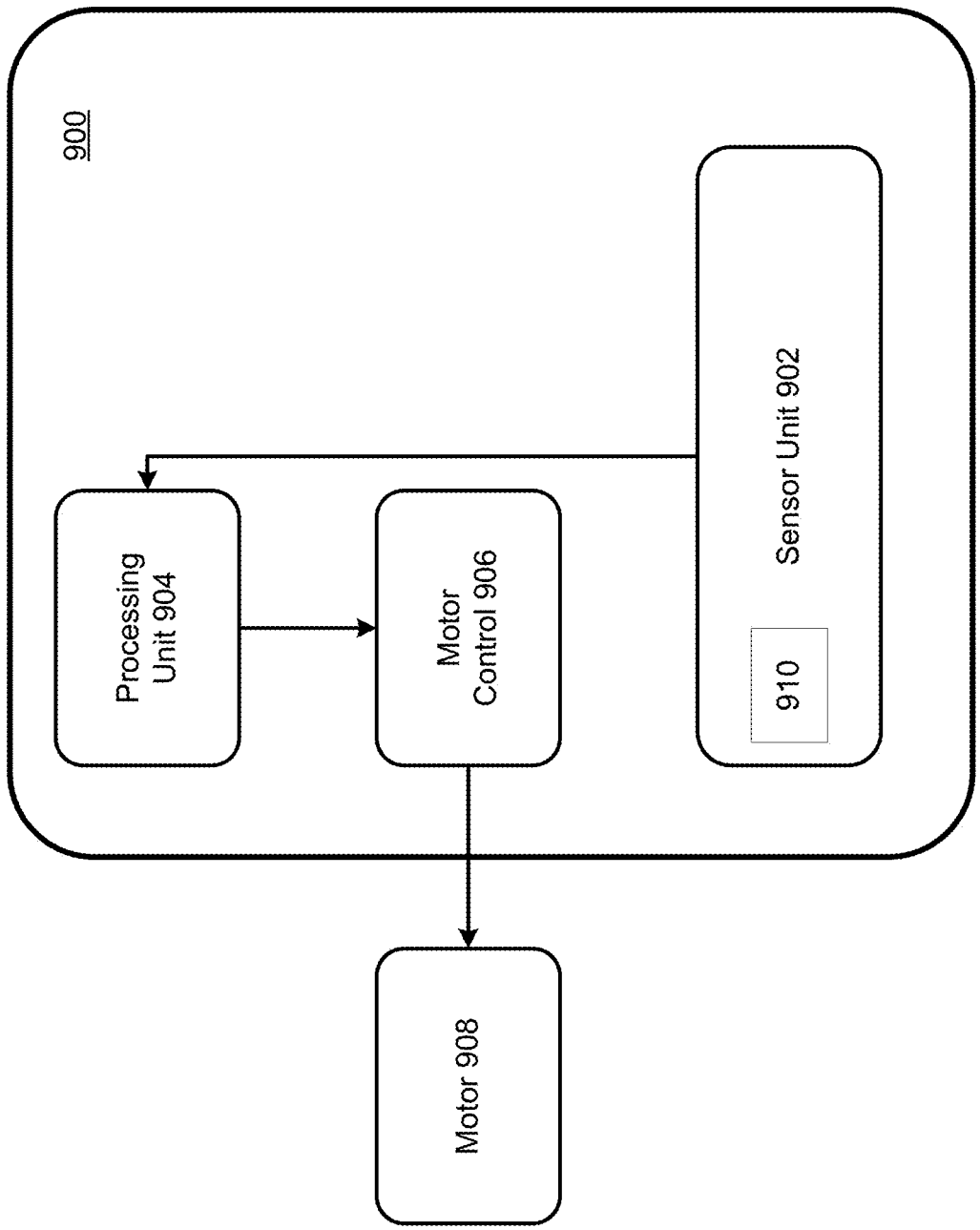
FIG. 9 is a block diagram illustrating an example robotic platform configured to detect obstacles during surface traversing, in accordance with some embodiments.

FIG. 9 is a block diagram illustrating an example robotic platform configured to detect obstacles during surface traversing, in accordance with some embodiments. In embodiments, some of the components of FIG. 9 correspond to components of FIG. 1. As shown, the robotic platform 900 includes a sensor unit 902. The sensor unit 902 may include one or more capacitive probes 910 described in reference to FIGS. 1-5, as well as other sensor arrangements, such as a camera, IMU (as described in reference to FIG. 8), wheel encoders, and the like.

The platform 900 further includes a processing unit 904, configured to process the readings similarly to the communication and/or processing unit 126 of FIG. 1, and to issue commands to operate the robotic platform, based on results of the processing. The platform 900 further includes a motor control unit 906, configured to operate a motor 908, which powers surface traversing means (e.g., wheels 504 in FIG. 5). The motor control unit 906 is coupled with the processing unit 904, and operates the motor 908 in response to receiving commands provided by the processing unit 904.

In operation, the capacitive probe in the sensor unit 902 sends the digital capacitance measurements to the processing unit 904. The probe can be calibrated at a base station prior to the robotic apparatus motion, by averaging the capacitance value over a short period of time. In addition or in the alternative, the probe may have a factory calibration.

The processing unit 904 measures the change in capacitance value during the apparatus motion for all available probes 910. The measurements may be filtered over time. When a capacitance change is determined to be above a pre-defined threshold level, the processing unit can provide the following outputs: a detected decrease in capacitance indicates a cliff detection, and a detected increase in capacitance indicates either fluid or surface anomaly. A pre-defined threshold may be determined to distinguish anomalies from fluid due to the water high dielectric coefficient. When high variance in the capacitance value is detected, and obstacle with a corrugated surface may be identified. At the detection of an anomaly, a probing of the obstacle may be performed by maneuvering the apparatus with the probe in the suspected obstacle location.

FIGS. 10-13 illustrate example dispositions of capacitive probes on a robotic apparatus for surface traversing, in accordance with some embodiments. Specifically, FIGS. 10-11 illustrate side views of dispositions of dual capacitive probes on the surface traversing apparatus 1000. In embodiments, the linear (dual) probe contains two probes co-located on a plane, the line between the probe locations is the direction of the measurement. Two signals are acquired from both probes to enhance the measurement.

In embodiments, a linear (dual) probe is disposed on the body 1002 of the surface traversing apparatus 1000 as shown in FIGS. 10-11. The dual probe includes two probes 1004 and 1006 co-located on a plane (e.g., a plane of the bottom 1008 of the apparatus body 1002, out of the page of FIGS. 10-11). An imaginary line between the probe locations substantially coincides with the direction 1010 of the measurement. Two signals are acquired from the probes 1006 and 1004 to enhance the measurement.

As shown in FIG. 10, the first probe 1004 may be located at the edge 1012 of the apparatus 1000 in a "forward looking" configuration described in reference to FIG. 7. The second probe 1006 is located on the bottom area 1014 proximate to the edge 1012. In the embodiment of FIG. 11, the probes 1004 and 1006 are disposed in an area adjacent to the edge 1012, similar to the embodiments of FIGS. 5-6. Specifically, the probes 1004 and 1006 are disposed on the bottom area 1014 of the body 1002, proximate to the edge 1012, substantially parallel to and facing a traversable surface 1016.

The double probes disposed on the apparatus as described above can be used as follows. The initial detection (e.g., with probe 1004) of surface anomaly or surface fluid can be verified by repeated measurement (e.g., with probe 1006) while the apparatus 1012 continues to move in the direction indicated by arrow 1010, thereby increasing the measurement's confidence and decreasing false alarms. The direction of obstruction can be verified using the double probe for small obstacles, allowing the apparatus 1000 to pass an obstacle by searching with repeated measurements for the obstacle's edges.

Figure 12:
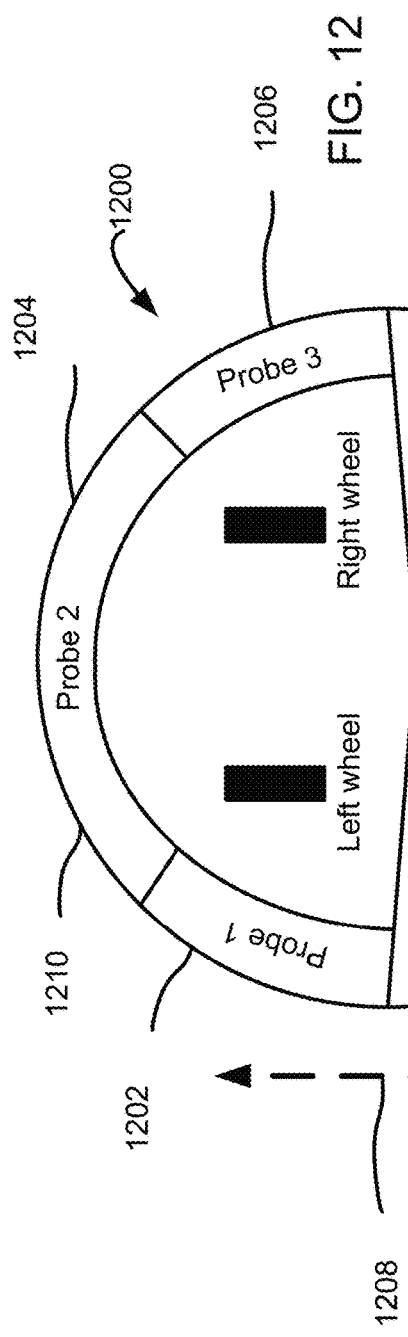

FIG. 12 illustrates a bottom view of example dispositions of capacitive probes on a robotic apparatus 1200 for surface traversing. As shown, the probes 1202, 1204, 1206 are disposed at the bottom 1212 of the apparatus 1200, around the edge 1210 of the apparatus 1200 body, where edge 1210 is a front edge of the apparatus 1200 relative to the direction of traverse 1208. The probes 1202, 1204, and 1206 are "down-looking", e.g., facing the surface (not shown), which the apparatus 1200 is to traverse. Three probes are shown in FIG. 12 for purposes of illustration only; it is understood that any number of probes may be disposed around the front edge 1210 of the apparatus 1200.

Figure 13:
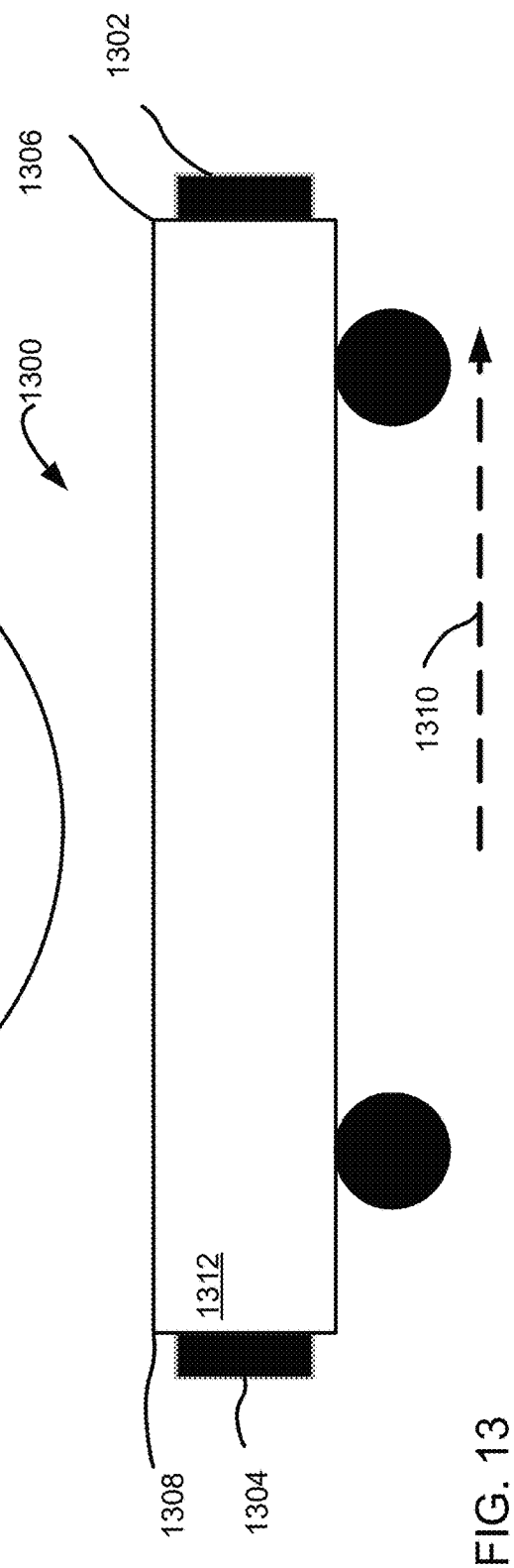

FIG. 13 illustrates a side view of example dispositions of capacitive probes on a robotic apparatus 1300 for surface traversing. As shown, the probes 1302 and 1304 are disposed at the front edge 1306 and back edge 1308 of the body 1312 of the apparatus 1300 respectively, relative to the direction of traverse 1310. As shown, the probes 1302 and 1304 are disposed on the edges 1306 and 1308 in a forward-looking configuration, similar to the embodiments of FIG. 7.

In some embodiments, surface traversing robotic apparatus can be controlled to adjust its motion and perform other operations, based on results of readings of capacitive probes. For example, the communication and/or processing unit 126 or an external processing device 130 of FIG. 1 may operate the robotic apparatus to: halt a motion of the apparatus, perform a maneuver to verify the readings, mark a location of capacitive probe relative to the portion of the surface, or update a planning of the apparatus motion active operation. For example, if a cliff, surface anomaly, or fluid have been detected by the capacitive probe or a combination of capacitive probes, the robotic apparatus may perform a maneuver to verify this data.

Accordingly, if a cliff was detected in front of the robotic apparatus, for example at a distance about 5 cm, the apparatus may maneuver back and forth so that the capacitive probe repeatedly returns to the assumed location of the cliff (e.g., to position 508' over the area 534 as illustrated in FIG. 5), and repeats the detection. By accumulating capacitive signals resulting from the performed maneuvers, the processing unit may reject outlier detections, and thus increase the robustness of the system.

Figure 14:
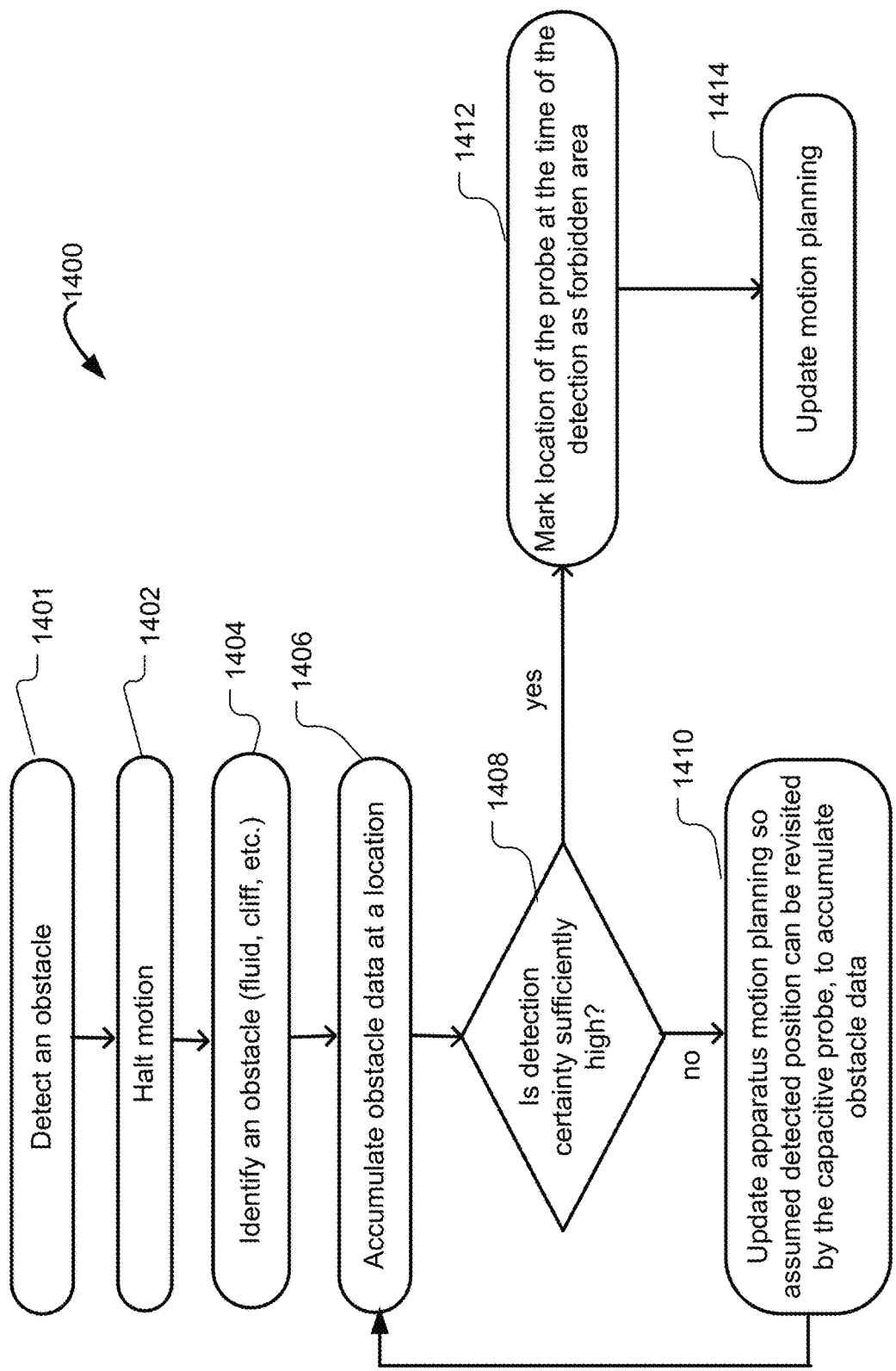
FIG. 14 illustrates an example process 1400 for surface traversing by a robotic apparatus, in accordance with some embodiments.

FIG. 14 illustrates an example process 1400 for surface traversing by a robotic apparatus, in accordance with some embodiments. The process 1400 may be performed, for example, by the system 100 configured as described in reference to FIG. 1 (e.g., by circuitry 116, and specifically communications and/or processing unit 126), and/or robotic platform described in reference to FIG. 9 (e.g., processing unit 904). It will be appreciated that the order of description may not be construed as to imply that the operations of the process 1400 described below are necessarily order dependent. In particular, these operations may not be performed in the order of presentation. At least some or all of the operations of process 1400 may be performed in a different order than the described embodiment, as will be evident from the description below.

The process 1400 begins at block 1401, where an obstacle on a surface is detected. As discussed above, a change in a dielectric property of a portion of the surface proximate to the edge of the surface traversing apparatus may be sensed by a capacitive probe and the readings provided to the processing unit. The processing unit can determine that dielectric property change is above a predetermined threshold, which can indicate an obstacle associated with the surface portion.

At block 1402, the apparatus motion can be halted, at least temporarily, in order not to collide with or otherwise be damaged by the detected obstacle.

At block 1404, a type of obstacle is identified. As described above, the type of obstacle may be identified based on the value of the capacitance change sensed during the surface traversing by the apparatus, wherein the capacitance change indicates the obstacle associated with the surface portion, and/or on a type of change (decrease in capacitance over a first threshold, or increase in capacitance over a second threshold, where first threshold may or may not be equal the second threshold). For example, a decrease in capacitance over a first threshold indicates a presence of an edge of the surface, and an increase in capacitance over a second threshold indicates a presence of a fluid on the surface or an anomaly of the surface (e.g., unevenness or an obstruction, such as a bump).

At block 1406, obstacle data at a location is accumulated. For example, the processing unit can command the apparatus to perform multiple measurements of the surface using the capacitive probe.

At decision block 1408, it is determined whether the capacitance detection has been made with desired certainty. In other words, it is determined whether the probability of the correct detection is sufficiently high (above a certain threshold). For example, probability pi is associated with the i'th detection event (i.e. the probability that this is a false event is (1−pi)). If 100% repeat of the detections is required (and assuming independent detections), the accumulated uncertainty can be estimated as (1−p1)*(1−p2)*(1−p3) . . . , e.g., it will be exponentially decaying with the number of measurements. In order to estimate pi it may be assumed that there is a function between the measured signal and the detection probability that was learned from experiment (i.e. this function can be calibrated).

If it is determined that the detection certainty is not sufficiently high, the process 1400 moves to block 1410, where the apparatus motion planning can be updated so that the assumed detected position (block 1402) can be revisited by the apparatus (and correspondingly by the capacitive probe), to accumulate obstacle data. The process 1400 then reverts to block 1406.

If it is determined that the detection certainty is sufficiently high, the process 1400 moves to decision block 1412, where it is determined whether the object detection is validated. If it is determined that the object was not validly detected (e.g., false alarm), the process 1400 ends. If it is determined that the object detection is valid, the process 1400 moves to block 1414.

The object detection validation can be implemented, for example, as follows. It is assumed that the data regarding the probability of object detection and the probability of no object detection has been accumulated. For example, consider the detection uncertainty associated with "object" event p_object and the detection uncertainty associated with "no object" event, p_no_object have been accumulated. A statistical test (e.g. Neyman-Pearson) can be performed to determine if any of the possible events (e.g., "object", "no object") is statistically significant, with some pre-determined p value (e.g. 0.95).

At block 1414, the location of the probe at the time of the detection is marked as forbidden area, e.g., area which may not be entered by the robotic apparatus.

At block 1416, motion planning is updated to reflect the obstacle detection and the corresponding forbidden area, in order for the apparatus to avoid entering the forbidden area. In embodiments, some properties of the obstacle may be also measured and/or calculated. For example, the estimated dielectric constant, the height of the obstacle from the surface, (e.g., as measured by a depth sensor), the color and/or texture of the obstacle (e.g., as imaged by an attached camera), or the like.

Figure 15:
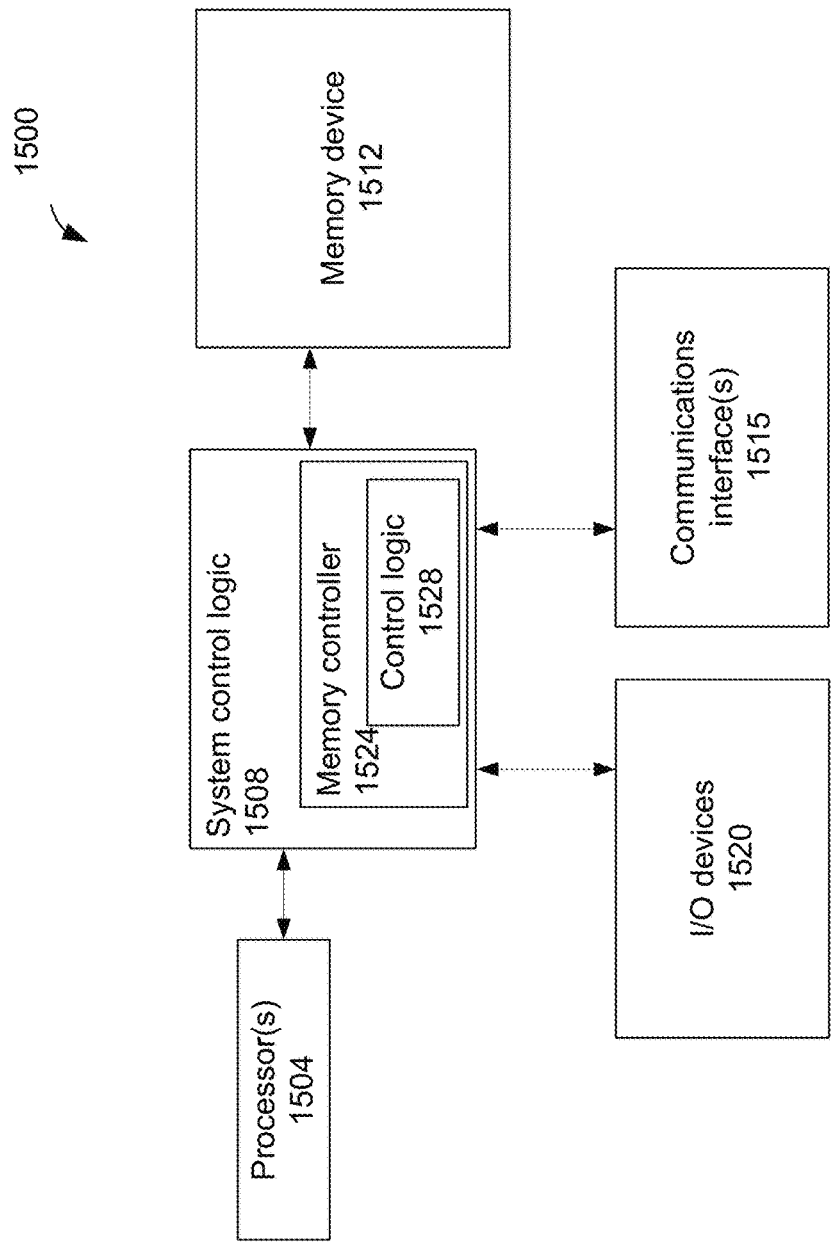
FIG. 15 illustrates an example computing device suitable for use to practice all or selected aspects of the present disclosure, in accordance with some embodiments.

FIG. 15 illustrates an example computing device suitable for use to practice all or selected aspects of the present disclosure, in accordance with some embodiments. More specifically, the computing device 1500 may be configured to perform some or all of the functions of the communications and/or processing unit 126 and/or external computing device 130 of FIG. 1, and/or processing unit 904 of FIG. 9. In some embodiments, the computing device 1500 may be configured as a special purpose computing device, i.e. a computing device configured solely for the purpose of performing operations associated with the surface traversing by a robotic apparatus, such as the process of FIG. 14, and not for general purpose computing, such as processor based devices configured for use as set-top box, game console, smartphones, e-book, tablets for consuming audio/video contents, and so forth. In some embodiments, the computing device 1500 may be configured as a general purpose computing device, with facilities configured to execute virtually any binaries (subject only to computing cycles, and/or memory/storage constraints).

As shown, the computing device 1500 includes system control logic 1508 coupled to one or more processor(s) 1504; a memory device 1512; one or more communications interface(s) 15115; and input/output (I/O) devices 1520.

The memory device 1512 may be a non-volatile computer storage chip. In embodiments, the memory device 1512 comprises a package, driver circuitry (e.g., drivers), input/output connections to electrically couple the memory device 1512 with other components of the computing device 1500, etc. The memory device 1512 may be configured to be removably or permanently coupled with the computing device 1500.

Communications interface(s) 1515 may provide an interface for computing device 1500 to communicate over one or more network(s) and/or with any other suitable device, e.g., in a system described in reference to FIG. 1. Communications interface(s) 1515 may include any suitable hardware and/or firmware. Communications interface(s) 1515 for one embodiment may include, for example, a network adapter, a wireless network adapter, a telephone modem, and/or a wireless modem. For wireless communications, communications interface(s) 1515 for one embodiment may use one or more antennas to communicatively couple the computing device 1500 with a wireless network.

For one embodiment, at least one of the processor(s) 1504 may be packaged together with logic for one or more controller(s) of system control logic 1508. For one embodiment, at least one of the processor(s) 1504 may be packaged together with logic for one or more controllers of system control logic 1508 to form a System in Package (SiP). For one embodiment, at least one of the processor(s) 1504 may be integrated on the same die with logic for one or more controller(s) of system control logic 1508. For one embodiment, at least one of the processor(s) 1504 may be integrated on the same die with logic for one or more controller(s) of system control logic 1508 to form a System on Chip (SoC).

System control logic 1508 for one embodiment may include any suitable interface controllers to provide for any suitable interface to at least one of the processor(s) 1504 and/or to any suitable device or component in communication with system control logic 1508. The system control logic 1508 may move data into and/or out of the various components of the computing device 1500.

System control logic 1508 for one embodiment may include a memory controller 1524 to provide an interface to the memory device 1512 to control various memory access operations. The memory controller 1524 may include control logic 1528 that may be specifically configured to control access of the memory device 1512.

In various embodiments, the I/O devices 1520 may include user interfaces designed to enable user interaction with the computing device 1500, peripheral component interfaces designed to enable peripheral component interaction with the computing device 1500, and/or sensors designed to determine environmental conditions and/or location information related to the computing device 1500.

In various embodiments, the user interfaces could include, but are not limited to, a display, e.g., a liquid crystal display, a touch screen display, etc., a speaker, a microphone, one or more digital cameras to capture pictures and/or video, a flashlight (e.g., a light emitting diode flash), and a keyboard.

In various embodiments, the peripheral component interfaces may include, but are not limited to, a non-volatile memory port, an audio jack, and a power supply interface.

In various embodiments, the sensors may include, but are not limited to, a gyro sensor, an accelerometer, a proximity sensor, an ambient light sensor, and a positioning unit. The positioning unit may additionally/alternatively be part of, or interact with, the communication interface(s) 1515 to communicate with components of a positioning network, e.g., a global positioning system (GPS) satellite.

In some implementations, the computing device 1500 may comprise a general purpose computing device, such as a laptop, a netbook, a notebook, an ultrabook, a desktop computer, or a server. In further implementations, the computing device 1500 may be any other electronic device that processes data.

Figure 16:
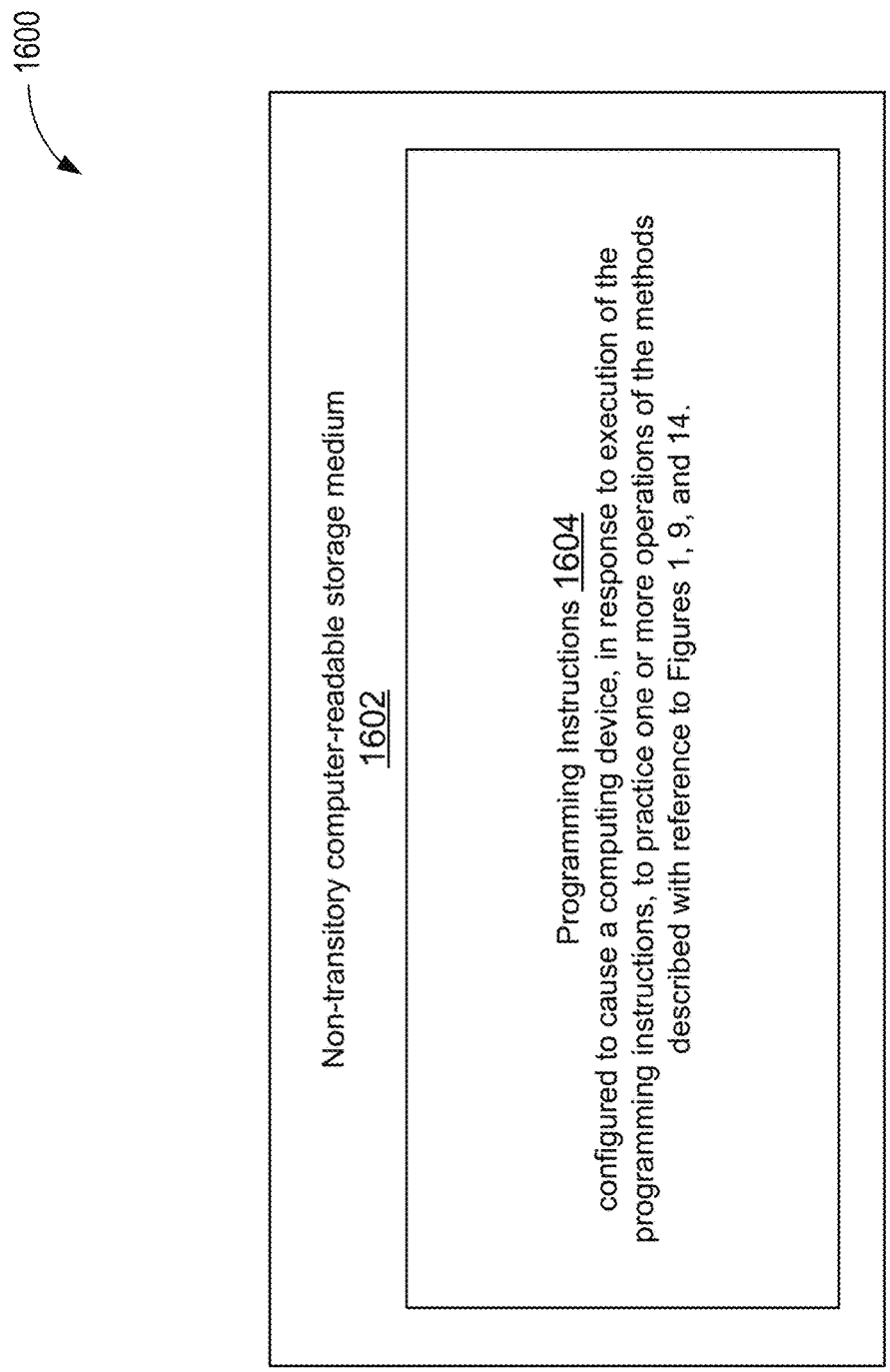
FIG. 16 illustrates an example computer-readable storage medium having instructions configured to cause a processor-based device to practice all or selected aspects of the present disclosure, in accordance with some embodiments.

FIG. 16 illustrates an example computer-readable storage medium having instructions configured to cause a processor-based device to practice all or selected aspects of the present disclosure, in accordance with some embodiments. As illustrated, computer-readable storage medium 1602 may include a number of programming instructions or bit streams 1604. Executable code of programming instructions (or bit streams) 1604 may be configured to enable a device, e.g., computing device 1500, in response to execution of the executable code/programming instructions to perform (aspects of) processes (e.g., FIG. 14) performed by 126, 130, 904, or corresponding components described in reference to FIGS. 1 and 9.

In alternate embodiments, executable code/programming instructions/bit streams 1604 may be disposed on multiple non-transitory computing device-readable storage medium 1602 instead. In embodiments, computing device-readable storage medium 1602 may be non-transitory. In still other embodiments, executable code/programming instructions 1604 may be encoded in transitory computer readable medium, such as signals.

According to various embodiments, the present disclosure describes a number of examples.

Example 1 is an apparatus for surface traversing, comprising: a body having at least one edge that faces a direction of traverse of a surface by the apparatus, and at least one capacitive probe disposed on or in proximity to the at least one edge, to detect, during the traverse of the surface, a change in a dielectric property of a portion of the surface proximate to the at least one edge, wherein the dielectric property change indicates an obstacle associated with the surface portion.

Example 2 includes the subject matter of Example 1, further comprising a stabilizer attached to the body on or in proximity to the at least one edge, wherein the probe is coupled to the stabilizer, wherein the stabilizer is to keep the probe at a substantially constant distance from the surface during the surface traverse.

Example 3 includes the subject matter of Example 1, wherein the body includes an area underneath the body proximate to the edge, wherein the at least one capacitive probe is disposed in the area underneath the body.

Example 4 includes the subject matter of Example 1, wherein the capacitive probe is disposed substantially parallel to the surface.

Example 5 includes the subject matter of Example 1, wherein the capacitive probe is disposed at an angle to the surface.

Example 6 includes the subject matter of Example 1, further comprising circuitry coupled with the capacitive probe, to process readings of the probe.

Example 7 includes the subject matter of Example 6, wherein the circuitry is to generate instructions to adjust the traversing of the surface by the apparatus, based at least in part on a result of the probe readings processing.

Example 8 includes the subject matter of Example 6, further comprising a sensor disposed on the body and coupled with the capacitive probe and circuitry, to sense a distance between the probe and the surface, wherein the circuitry is to apply the sensed distance to the readings processing, to compensate for a probe sensitivity to the distance to the surface.

Example 9 includes the subject matter of Example 1, wherein the obstacle associated with the surface portion includes at least one of: a presence of liquid on the surface; an anomaly of the surface, which includes unevenness or obstruction; or an edge of the surface, which includes a cliff, a bluff, a precipice, or an escarpment.

Example 10 includes the subject matter of any of Examples 1 to 9, wherein the at least one capacitive probe includes at least first and second probes disposed on or in proximity to the at least one edge along an axis that is parallel to the direction of traverse of the surface by the apparatus.

Example 11 is a method for surface traversing, comprising: detecting, by at least one capacitive probe disposed on or in proximity to an edge of a body of an apparatus, during the apparatus traversing of a surface, a change in a dielectric property of a portion of the surface proximate to the edge, wherein the dielectric property change indicates an obstacle associated with the surface portion; identifying, by circuitry disposed in the apparatus and coupled with the at least one capacitive probe, the obstacle indicated by the dielectric property change in the surface portion; and adjusting, by the circuitry, a trajectory of traversing the surface by the apparatus, based at least in part on the detected obstacle of the portion of the surface.

Example 12 includes the subject matter of Example 11, further comprising: processing, by the circuitry, readings of the probe, wherein the adjusting of the trajectory is further based on a result of the processing of the readings.

Example 13 includes the subject matter of Example 12, wherein the adjusting includes: generating, by the circuitry, one or more commands to: halt the traversing of the surface by the apparatus, mark a location of the probe in relation to the surface, or perform a motion maneuver on the surface to verify the readings of the probe.

Example 14 includes the subject matter of any of the Examples 11 to 13, wherein detecting the change in the dielectric property of the surface portion includes sensing, by the capacitive probe, a change in capacitance during the surface traversing by the apparatus, wherein the capacitance change indicates the obstacle associated with the surface portion, wherein a decrease in capacitance indicates a presence of an edge of the surface, and wherein an increase in capacitance indicates a presence of a fluid on the surface or an anomaly of the surface.

Example 15 is a system for detecting obstacles during surface traversing, comprising: at least one capacitive probe, to be disposed on or in proximity to an edge of an apparatus, to detect, during a traverse of the surface by the apparatus, a change in capacitance of a portion of the surface proximate to the edge, wherein the capacitance change corresponds to a change of a dielectric property of the surface portion, wherein the dielectric property change indicates an obstacle associated with the surface portion; and circuitry coupled to the capacitive probe, to process readings of capacitance provided by the capacitive probe, or cause the capacitance readings processing; identify or cause to be identified the obstacle based at least in part on the processed readings; and adjust or cause to be adjusted a trajectory of the surface traversing by the apparatus, based at least in part on the detected obstacle of the portion of the surface.

Example 16 includes the subject matter of Example 15, wherein the circuitry is to generate commands associated with the surface traversing trajectory adjustment, in response to the detection of the change in the dielectric property of the surface portion, wherein the system further comprises a motor control unit coupled with the circuitry, to implement the commands to adjust the trajectory of the surface traversing.

Example 17 includes the subject matter of Example 16, wherein the commands include at least one of: halt a motion of the apparatus, perform a maneuver to verify the readings, mark a location of capacitive probe relative to the portion of the surface, or update a planning of the apparatus motion.

Example 18 includes the subject matter of Example 15, wherein the at least one capacitive probe is a first probe, wherein the edge is a first edge that faces a direction of traverse of the surface by the apparatus, wherein the system further includes a second edge disposed on the apparatus opposite the first edge, and a second capacitive probe, to be disposed on or in proximity to the second edge of the apparatus.

Example 19 includes the subject matter of Example 15, wherein the circuitry includes: a capacitance measurement circuit coupled with the at least one capacitive probe, to measure the capacitance readings; and a communication unit, to communicate the measured readings to an external processing device for the readings processing; or a processing unit, to process the measured readings.

Example 20 includes the subject matter of any of Examples 15 to 19, wherein the obstacle associated with the surface portion includes at least one of: a presence of liquid on the surface; an anomaly of the surface, which includes unevenness or obstruction; or an edge of the surface, which includes a cliff, a bluff, a precipice, or an escarpment.

Although certain embodiments have been illustrated and described herein for purposes of description, a wide variety of alternate and/or equivalent embodiments or implementations calculated to achieve the same purposes may be substituted for the embodiments shown and described without departing from the scope of the present disclosure. This application is intended to cover any adaptations or variations of the embodiments discussed herein. Therefore, it is manifestly intended that embodiments described herein be limited only by the claims.

What is claimed is:

1. An apparatus for surface traversing, comprising:
a body having at least one edge that faces a direction of traverse of a surface by the apparatus, and
at least one capacitive probe disposed on or in proximity to the at least one edge, to detect, during the traverse of the surface, a change in a dielectric property of a portion of the surface proximate to the at least one edge, wherein the dielectric property change indicates an obstacle associated with the surface portion.

2. The apparatus of claim 1, further comprising a stabilizer attached to the body on or in proximity to the at least one edge, wherein the probe is coupled to the stabilizer, wherein the stabilizer is to keep the probe at a substantially constant distance from the surface during the surface traverse.

3. The apparatus of claim 1, wherein the body includes an area underneath the body proximate to the edge, wherein the at least one capacitive probe is disposed in the area underneath the body.

4. The apparatus of claim 1, wherein the capacitive probe is disposed substantially parallel to the surface.

5. The apparatus of claim 1, wherein the capacitive probe is disposed at an angle to the surface.

6. The apparatus of claim 1, further comprising circuitry coupled with the capacitive probe, to process readings of the probe.

7. The apparatus of claim 6, wherein the circuitry is to generate instructions to adjust the traversing of the surface by the apparatus, based at least in part on a result of the probe readings processing.

8. The apparatus of claim 6, further comprising a sensor disposed on the body and coupled with the capacitive probe and circuitry, to sense a distance between the probe and the surface, wherein the circuitry is to apply the sensed distance to the readings processing, to compensate for a probe sensitivity to the distance to the surface.

9. The apparatus of claim 1, wherein the obstacle associated with the surface portion includes at least one of: a presence of liquid on the surface; an anomaly of the surface, which includes unevenness or obstruction; or an edge of the surface, which includes a cliff, a bluff, a precipice, or an escarpment.

10. The apparatus of claim 1, wherein the at least one capacitive probe includes at least first and second probes disposed on or in proximity to the at least one edge along an axis that is parallel to the direction of traverse of the surface by the apparatus.

11. A method for surface traversing, comprising:
detecting, by at least one capacitive probe disposed on or in proximity to an edge of a body of an apparatus, during the apparatus traversing of a surface, a change in a dielectric property of a portion of the surface proximate to the edge, wherein the dielectric property change indicates an obstacle associated with the surface portion;
identifying, by circuitry disposed in the apparatus and coupled with the at least one capacitive probe, the obstacle indicated by the dielectric property change in the surface portion; and
adjusting, by the circuitry, a trajectory of traversing the surface by the apparatus, based at least in part on the detected obstacle of the portion of the surface.

12. The method of claim 11, further comprising:
processing, by the circuitry, readings of the probe, wherein the adjusting of the trajectory is further based on a result of the processing of the readings.

13. The method of claim 12, wherein the adjusting includes:
generating, by the circuitry, one or more commands to: halt the traversing of the surface by the apparatus, mark a location of the probe in relation to the surface, or perform a motion maneuver on the surface to verify the readings of the probe.

14. The method of claim 11, wherein detecting the change in the dielectric property of the surface portion includes sensing, by the capacitive probe, a change in capacitance during the surface traversing by the apparatus, wherein the capacitance change indicates the obstacle associated with the surface portion, wherein a decrease in capacitance indicates a presence of an edge of the surface, and wherein an increase in capacitance indicates a presence of a fluid on the surface or an anomaly of the surface.

15. A system for detecting obstacles during surface traversing, comprising:
at least one capacitive probe, to be disposed on or in proximity to an edge of an apparatus, to detect, during a traverse of the surface by the apparatus, a change in capacitance of a portion of the surface proximate to the edge, wherein the capacitance change corresponds to a change of a dielectric property of the surface portion, wherein the dielectric property change indicates an obstacle associated with the surface portion; and
circuitry coupled to the capacitive probe, to process readings of capacitance provided by the capacitive probe, or cause the capacitance readings processing; identify or cause to be identified the obstacle based at least in part on the processed readings; and adjust or cause to be adjusted a trajectory of the surface traversing by the apparatus, based at least in part on the detected obstacle of the portion of the surface.

16. The system of claim 15, wherein the circuitry is to generate commands associated with the surface traversing trajectory adjustment, in response to the detection of the change in the dielectric property of the surface portion, wherein the system further comprises a motor control unit coupled with the circuitry, to implement the commands to adjust the trajectory of the surface traversing.

17. The system of claim 16, wherein the commands include at least one of: halt a motion of the apparatus, perform a maneuver to verify the readings, mark a location of capacitive probe relative to the portion of the surface, or update a planning of the apparatus motion.

18. The system of claim 15, wherein the at least one capacitive probe is a first probe, wherein the edge is a first edge that faces a direction of traverse of the surface by the apparatus, wherein the system further includes a second edge disposed on the apparatus opposite the first edge, and a second capacitive probe, to be disposed on or in proximity to the second edge of the apparatus.

19. The system of claim 15, wherein the circuitry includes:
- a capacitance measurement circuit coupled with the at least one capacitive probe, to measure the capacitance readings; and
- a communication unit, to communicate the measured readings to an external processing device for the readings processing; or a processing unit, to process the measured readings.

20. The system of claim 15, wherein the obstacle associated with the surface portion includes at least one of: a presence of liquid on the surface; an anomaly of the surface, which includes unevenness or obstruction; or an edge of the surface, which includes a cliff, a bluff, a precipice, or an escarpment.

* * * * *